(12) United States Patent
Suzuki (10) Patent No.: US 10,263,622 B2
(45) Date of Patent: Apr. 16, 2019

(54) SEMICONDUCTOR APPARATUS AND METHOD OF CONTROLLING MOS TRANSISTOR

(71) Applicant: SONY CORPORATION, Tokyo (JP)

(72) Inventor: Tsuyoshi Suzuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/310,002

(22) PCT Filed: May 11, 2015

(86) PCT No.: PCT/JP2015/002378
§ 371 (c)(1),
(2) Date: Nov. 9, 2016

(87) PCT Pub. No.: WO2015/177982
PCT Pub. Date: Nov. 26, 2015

(65) Prior Publication Data
US 2017/0155392 A1 Jun. 1, 2017

(30) Foreign Application Priority Data
May 19, 2014 (JP) .................. 2014-103408

(51) Int. Cl.
*H03K 19/0948* (2006.01)
*H01L 27/092* (2006.01)
(Continued)

(52) U.S. Cl.
CPC ..... *H03K 19/0948* (2013.01); *G01R 31/2621* (2013.01); *H01L 22/34* (2013.01);
(Continued)

(58) Field of Classification Search
CPC ............ H03K 19/094; H03K 19/0944; H03K 19/0948; H01L 21/822; H01L 21/8232;
(Continued)

(56) References Cited

U.S. PATENT DOCUMENTS 6,124,752 A * 9/2000 Kuroda ................ H02M 3/073
327/534
6,150,869 A * 11/2000 Storino ............. H03K 19/0963
326/98

(Continued)

FOREIGN PATENT DOCUMENTS

JP      09-326688 A    12/1997
JP    2000-077992 A     3/2000
(Continued)

*Primary Examiner* — Patrick O Neill
(74) *Attorney, Agent, or Firm* — Chip Law Group (57) ABSTRACT

[Object] To provide a semiconductor apparatus and a method of controlling a MOS transistor, with which a leak current of the MOS transistor can be suppressed. [Solving Means] A semiconductor apparatus includes a MOS transistor and a voltage application unit that applies, when the MOS transistor is off, a voltage for controlling a threshold value of the MOS transistor in a shallower direction onto a substrate of the MOS transistor.

9 Claims, 9 Drawing Sheets

(51) Int. Cl.
*H03K 19/094* (2006.01)
*G01R 31/26* (2014.01)
*H01L 21/66* (2006.01)
*H03K 19/173* (2006.01)

(52) U.S. Cl.
CPC ......... *H01L 27/092* (2013.01); *H03K 19/094* (2013.01); *H03K 19/1737* (2013.01)

(58) Field of Classification Search
CPC .............. H01L 21/8238; H01L 27/092; G01R 31/2601; G01R 31/2607; G01R 31/2621
See application file for complete search history.

(56) References Cited

U.S. PATENT DOCUMENTS

| | | | | |
|---|---|---|---|---|
| 7,227,366 B2* | 6/2007 | Rozen | ................ | G01R 31/2621 324/601 |
| 8,174,282 B2* | 5/2012 | Fujii | .................. | G01R 31/2621 257/48 |
| 2015/0042372 A1* | 2/2015 | Pan | .................... | G01R 31/2621 324/762.01 |
| 2017/0059645 A1* | 3/2017 | Pan | .................... | G01R 31/2607 |

FOREIGN PATENT DOCUMENTS

| | | |
|---|---|---|
| JP | 2008-288902 A | 11/2008 |
| WO | 03-094235 A1 | 11/2003 |

* cited by examiner

FIG. 1

|  | Vd_nonselect (V) | VCMOSPAD Potential (V) |
|---|---|---|
| At time of measuring Ion, Isoff | 0 | 0 |
| At time of measuring Idoff | Vd | Vd |

| NMOS DUT | D (V) | S (V) | G (V) | B (V) |
|---|---|---|---|---|
| NMOS | 0.9 | 0.9 | 0 | 0 |
| PMOS | 0.9 | 0.9 | 0.9 | 0.9 |

| PMOS DUT | D (V) | S (V) | G (V) | B (V) |
|---|---|---|---|---|
| NMOS | -0.9 | -0.9 | -0.9 | -0.9 |
| PMOS | -0.9 | -0.9 | 0 | 0 |

SEMICONDUCTOR APPARATUS AND METHOD OF CONTROLLING MOS TRANSISTOR

CROSS REFERENCE TO RELATED APPLICATIONS

This application is a U.S. National Phase of International Patent Application No. PCT/JP2015/002378 filed on May 11, 2015, which claims priority benefit of Japanese Patent Application No. JP 2014-103408 filed in the Japan Patent Office on May 19, 2014. Each of the above-referenced applications is hereby incorporated herein by reference in its entirety.

TECHNICAL FIELD

The present technology relates to a semiconductor apparatus including a MOS transistor and a method of controlling a MOS transistor.

BACKGROUND ART

In recent years, it has been found that, along with a progression of miniaturization of transistors, electrical characteristics of transistors largely vary depending on stresses on the transistors.

Therefore, in evaluating the characteristics of transistors, while it is necessary to prepare transistors having various layouts to measure a gate length, a gate width, a source/drain width, a device area space, well proximity, and the like, the arrangeable number of transistors is largely restricted at present due to restrictions on an area where the transistors are to be arranged.

As a technology for improving such a situation, there is a transistor array TEG (Test Element Group) in which transistors are arranged in an array and switches of the transistors to be measured are switched by a switch circuit (see Patent Document 1). A mainstream configuration of such a transistor array TEG is that a switch such as a CMOS switch is interposed between each of a gate/source/drain and a pad, and on/off of the switches is controlled by a selector circuit.

Patent Document 1: Japanese Patent Application Laid-open No. 2008-288902

SUMMARY

Problem to be Solved

In the transistor array TEG, since an off-leak current flowing from the CMOS switch to the pad flows in from another unselected transistor via the CMOS switch, it has been considered that an off current of a transistor to be measured cannot be monitored.

In view of the circumstances as described above, the present technology aims at providing a semiconductor apparatus and a method of controlling a MOS transistor, with which a leak current of the MOS transistor can be suppressed.

Means for Solving the Problem

According to the present technology, there is provided a semiconductor apparatus including: a MOS transistor; and a voltage application unit that applies, when the MOS transistor is off, a voltage for controlling a threshold value of the MOS transistor in a shallower direction onto a substrate of the MOS transistor.

According to the present technology, there is provided a method of controlling a MOS transistor, including: turning on/off the MOS transistor; and applying, when the MOS transistor is off, a voltage for controlling a threshold value of the MOS transistor in a shallower direction onto a substrate of the MOS transistor.

The MOS transistor is synonymous with MOSFET.

In the present technology, by applying, when the MOS transistor is off, the voltage for controlling the threshold value of the MOS transistor in the shallower direction onto the substrate of the MOS transistor, a leak current of the MOS transistor can be suppressed.

Effects

As described above, according to the present technology, the leak current of the MOS transistor can be suppressed.

DESCRIPTION OF PREFERRED EMBODIMENTS

Hereinafter, embodiments of the present technology will be described with reference to the drawings.

(First Embodiment)

Figure 1:
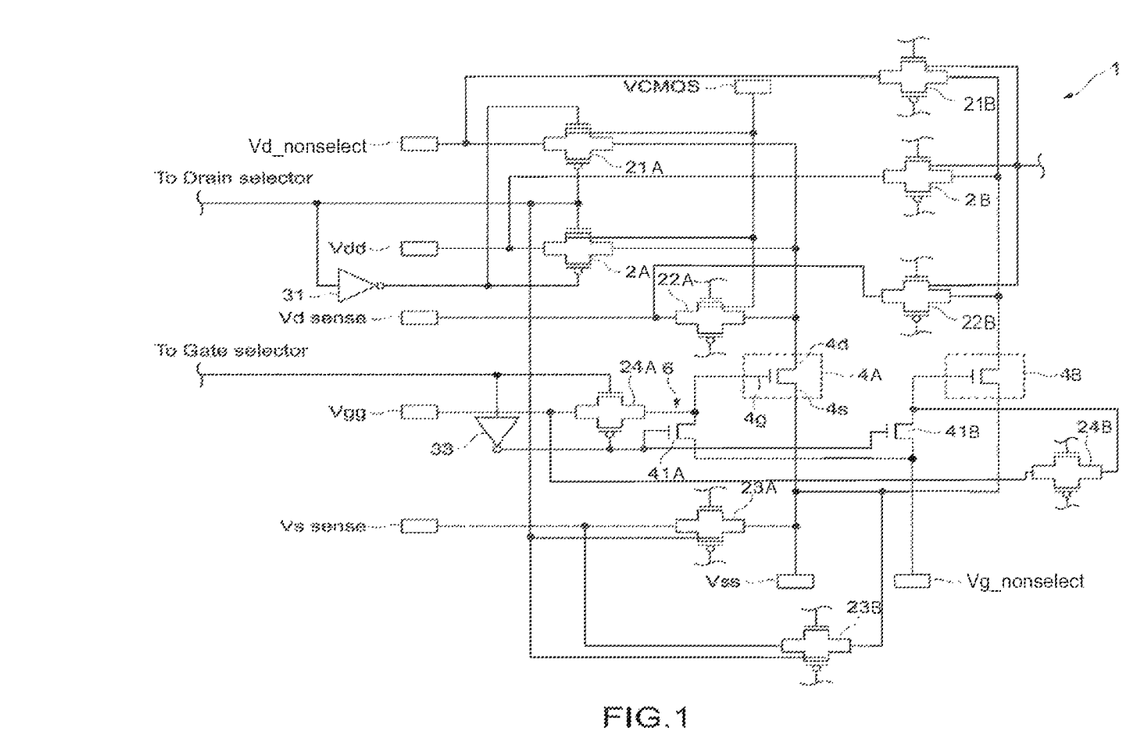
FIG. 1 A circuit diagram showing a configuration of a transistor array TEG (Test Element Group) as a semiconductor apparatus according to an embodiment of the present technology.

FIG. 1 is a circuit diagram showing a configuration of a transistor array TEG (Test Element Group) as a semiconductor apparatus according to an embodiment of the present technology.

As shown in the figure, the transistor array TEG 1 includes CMOS switches 2 each as a MOS transistor and a pad VCMOS as a voltage application unit.

The transistor array TEG 1 also includes NMOSs 4 as DUT (Device Under Test), that are each a transistor to be measured, a pad Vdd for extracting outputs from terminals of the NMOSs 4, and a selector circuit 6 for selecting a measurement target NMOS 4. The CMOS switches 2 are respectively interposed between the terminals of the NMOSs 4 and the pad Vdd.

More specifically, the CMOS switches 2 are connected to drain terminals of the NMOSs 4, and the pad VCMOS is a pad onto which a voltage is applied from outside for applying a voltage onto a substrate of NMOS configuring each of the CMOS switches 2.

The plurality of NMOSs 4 are arranged in an array as DUT.

The drain terminals 4$d$ of the NMOSs 4 are connected to the pad Vdd via the CMOS switches 2, connected to a pad Vd_nonselect via a CMOS switch 21, and connected to a pad Vd sense via a CMOS switch 22. The pad Vdd is one pad to which the drain terminals 4$d$ of the plurality of NMOSs 4 are commonly connected. On/off signals from a drain selector are input to a gate of NMOS of the CMOS switches 2 and a gate of PMOS of the CMOS switch 21 and input to, via an inverter 31, a gate of PMOS of the CMOS switches 2 and a gate of NMOS of the CMOS switch 21. The on/off signals from the drain selector are input individually to each of the NMOSs 4.

The pad Vdd is a pad for performing voltage application or current monitoring on the drain of the Tr. to be measured (selected Tr.). The pad Vd_nonselect is a pad for applying a voltage onto a drain of a not-to-be-measured Tr. (unselected Tr.). The pad Vd sense is a pad for monitoring a voltage applied onto the drain of the Tr. to be measured. Source terminals 4$s$ of the NMOSs 4 are connected to a pad Vss and also connected to a pad Vs sense via a CMOS switch 23. The pad Vss is a pad for applying a voltage to the source terminal of the Tr. to be measured or monitoring a current. The pad Vs sense is a pad for monitoring a voltage applied onto the source of the Tr. to be measured.

Gate terminals 4$g$ of the NMOSs 4 are connected to a pad Vgg via a CMOS switch 24. On/off signals from a gate selector are input to a gate of NMOS of the CMOS switch 24 and input to a gate of PMOS of the CMOS switch 24 via an inverter 33. The on/off signals from the gate selector are input individually to each of the NMOSs 4. Further, the on/off signals from the gate selector transmitted via the inverter 33 are input to gate terminals of MOS transistors 41 respectively connected to the gate terminals 4$g$ of the NMOSs 4. The gate terminal 4$g$ of the unselected MOS transistor 4 is connected to a pad Vg_nonselect via the MOS transistor 41.

The pad Vgg is a pad for applying a voltage onto a gate of the Tr. to be measured (selected Tr.). The pad Vg_nonselect is a pad for applying a voltage onto a gate of the unselected Tr.

The pad VCMOS is connected to the substrate of NMOS configuring each of the CMOS switches 2, and a voltage from outside is applied onto the substrate of NMOS configuring each of the CMOS switches 2 via the pad VCMOS. In other words, the pad VCMOS as a voltage application unit is used to apply a voltage onto the substrate of NMOS configuring the CMOS switches 2. Here, an NMOS back-gate terminal can be used for the voltage application, for example. The pad VCMOS is similarly connected to the substrate of NMOS configuring the CMOS switches 21 and 22. Further, the on/off signals from the drain selector are applied to the substrate of PMOS configuring the CMOS switch 23.

The transistor array TEG 1 configured as described above is a circuit that controls on/off of the CMOS switches 2 and 21 to 23 using transistors that select a plurality of output signal lines based on an input of serial signals from outside to output logical signals different from those of unselected transistors or transistors that select a plurality of output signal lines based on a combination of N-bit signals from N-bit input signal lines to output logical signals different from those of unselected transistors.

Figure 2:
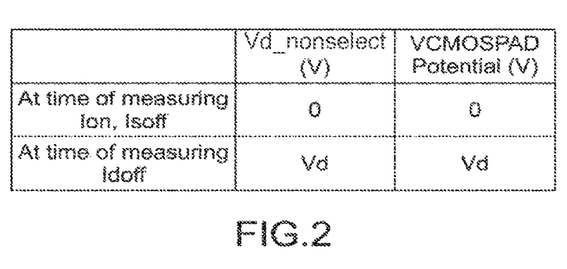
FIG. 2 A table showing application voltages to be switched based on measured amounts in a case where transistors to be measured are NMOS transistors in the transistor array TEG shown in FIG. 1.

In this embodiment, when measuring an off current of the right-hand NMOS 4B out of the two NMOSs 4 shown in FIG. 1, the CMOS switch 2B corresponding to the right-hand NMOS 4B is turned on and the CMOS switch 2A corresponding to the left-hand NMOS 4A is turned off. At this time, as shown in FIG. 2, the potential of NMOS substrates of the CMOS switches 2B, 21B, and 22B connected to the drain terminal 4$d$ of the right-hand NMOS 4B is set to 0 V (potential of pad Vss), and a voltage for controlling a threshold value of the MOS transistor in a shallower direction is applied onto the NMOS substrates of the CMOS switches 2A, 21A, and 22A connected to the drain terminal 4$d$ of the left-hand NMOS 4A. In other words, a voltage is applied so as to eliminate a potential difference between each of the NMOS substrates of the CMOS switches 2, 21, and 22 and the source (or drain). Here, a voltage Vd to be applied onto the drain terminal is applied onto the NMOS substrates of the CMOS switches 2, 21, and 22, for example. In this case, for example, in an external apparatus (not shown), the voltage of the pad Vdd may be applied onto the pad VCMOS as it is or a potential of the pad Vdd may be measured to apply a voltage of the same potential.

In this embodiment, by applying such a voltage, the off current on the side of the drain terminal of the NMOS 4 as DUT, which is a transistor to be measured, can be measured accurately.

In this embodiment, the transistor to be measured, which is DUT (Device Under Test), is constituted of an NMOS transistor, the CMOS switch 2 is connected to the drain terminal of the NMOS transistor as the transistor to be measured, and a predetermined voltage (Vd) is applied to the substrate of NMOS configuring the CMOS switch 2 at a time the transistor is off. However, the CMOS switch 2 may alternatively be connected to the source terminal of the NMOS transistor as the transistor to be measured, and in such a case, a predetermined voltage only needs to be applied onto the substrate of PMOS configuring the CMOS switch 2. With the circuit configuration in which the substrate potential of PMOS configuring the right-hand CMOS switch 23B is Vdd and the substrate potential of PMOS configuring the left-hand CMOS switch 23A is 0 V, a leakage from the CMOS switches leading to the source terminal can be suppressed.

Figure 3:
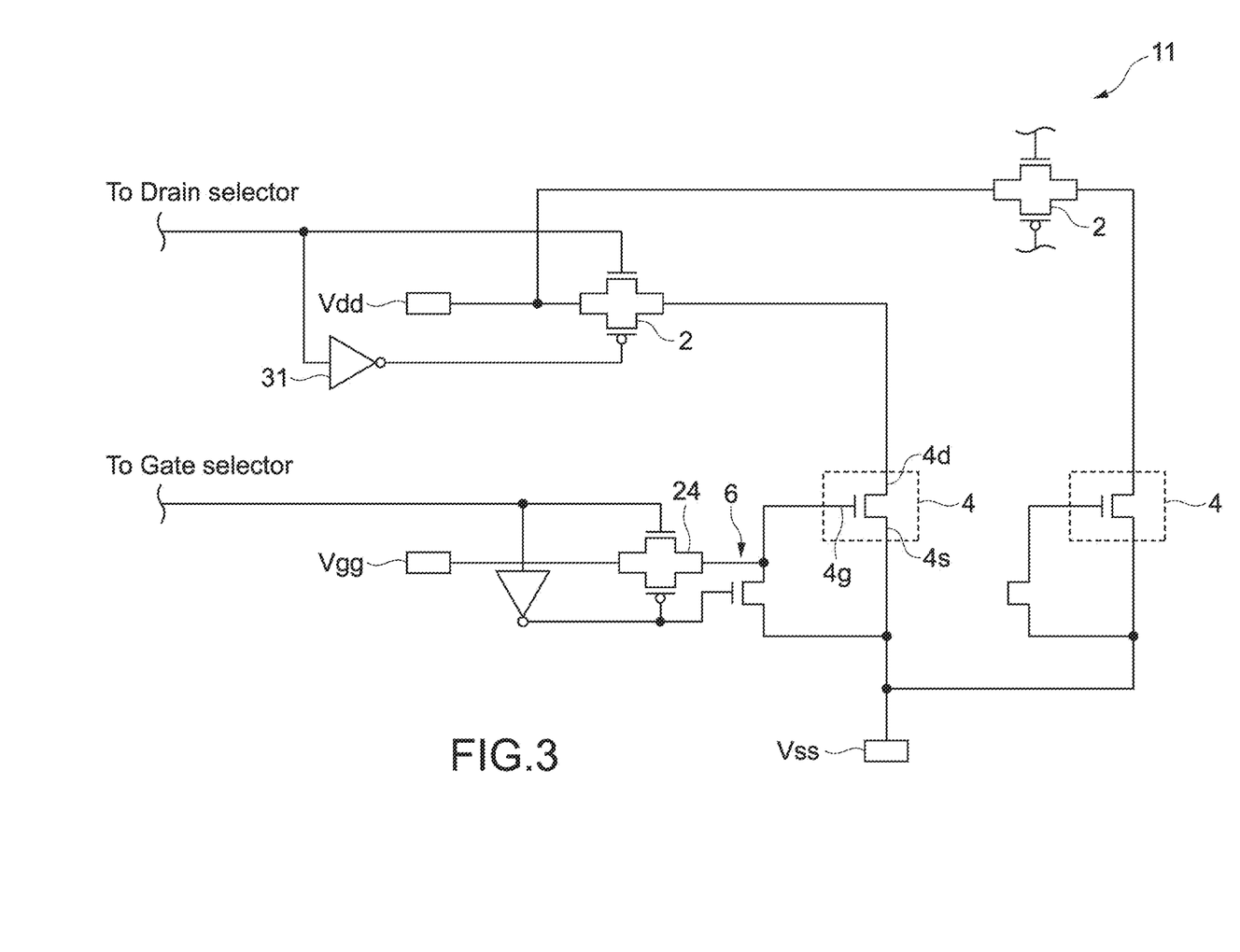
FIG. 3 A circuit diagram showing a configuration of the transistor array TEG (Test Element Group) as a comparative example.

FIG. 3 shows a circuit configuration of a transistor array TEG 11 that is not configured to apply the voltage described above as a comparative example. In FIG. 3, elements that are the same as those shown in FIG. 1 are denoted by the same symbols. Further, FIG. 4 is a schematic cross-sectional diagram of the MOS transistor configuring the CMOS switch 2.

Figure 4:
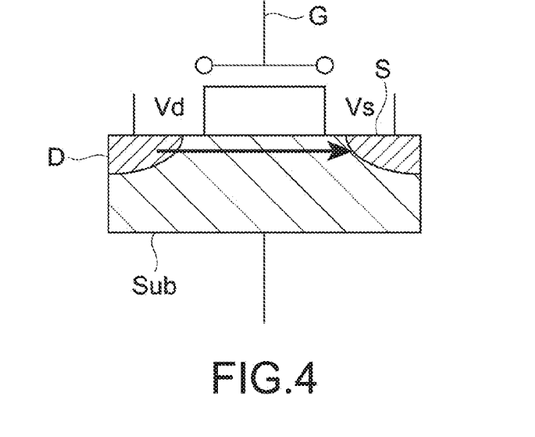
FIG. 4 A diagram for explaining a current leak model of a MOS transistor of the related art.

In the transistor array TEG 11 shown in FIG. 3, it has been considered that a leak current flowing into the pad Vdd from the CMOS switches 2 is due to a difference between the drain D-side potential Vd and the source S-side potential Vs in a state where the gate G of the MOS transistors configuring the CMOS switches 2 is off as shown in FIG. 4 (see arrow in FIG. 4).

Therefore, it has been considered that the leak current cannot be suppressed as long as the off-leak current of the transistor 4 to be measured is set to 0, and a selective measurement of a leak current of the transistor 4 to be measured (e.g., measuring off current of only right-hand transistor 4B to be measured in FIG. 3) has been abandoned in the transistor array TEG 11. Therefore, the only alternative was to prepare a TEG 11 excluding the unselected transistor 4 to be measured and estimate offsets.

Figure 5:
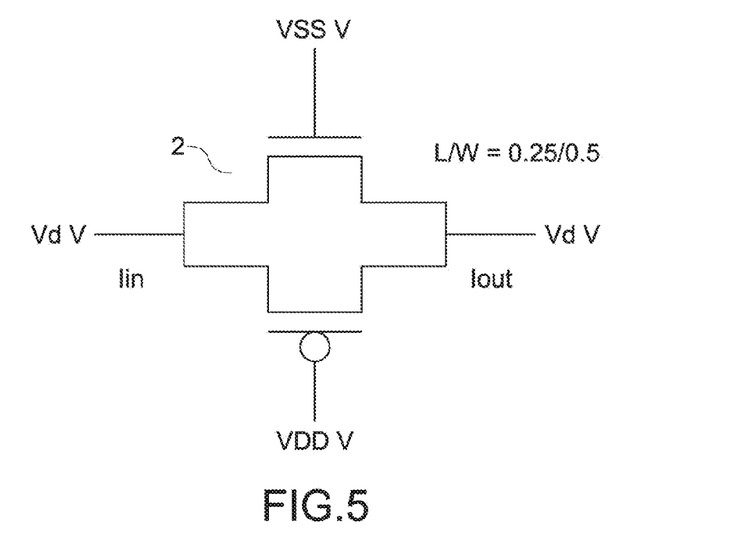
FIG. 5 A diagram showing a configuration example of a CMOS switch for explaining a circuit simulation.
Figure 6:
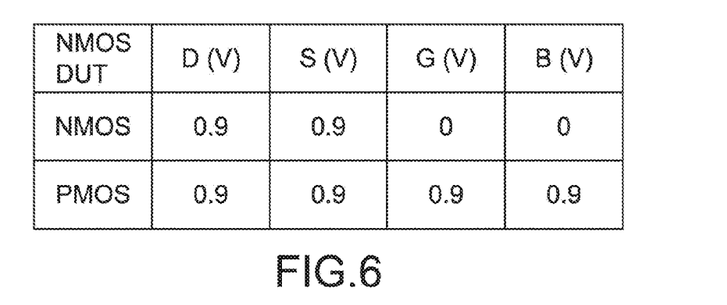
FIG. 6 A table showing an example of application voltages with respect to the CMOS switch shown in FIG. 5.
Figure 7:
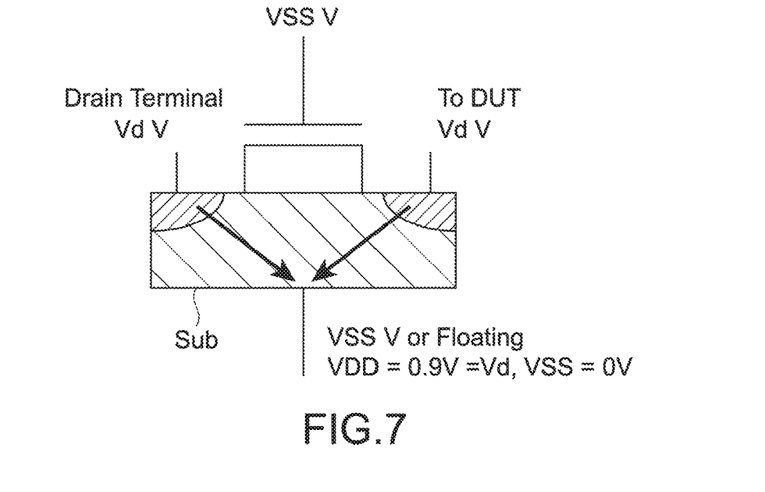
FIG. 7 A diagram for explaining a current leak model of the MOS transistor according to the embodiment of the present technology (transistor to be measured is NMOS).
Figure 8:
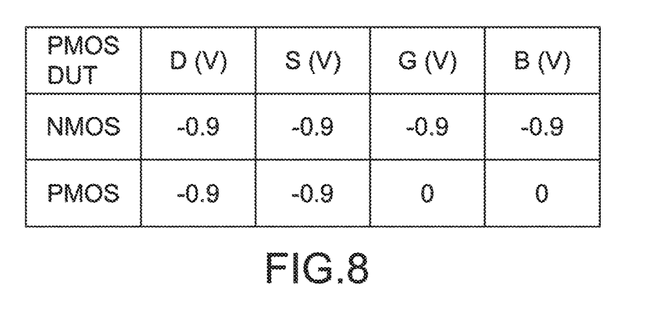
FIG. 8 A table showing an example of application voltages with respect to the CMOS switch shown in FIG. 5 (transistor to be measured is PMOS).
Figure 9:
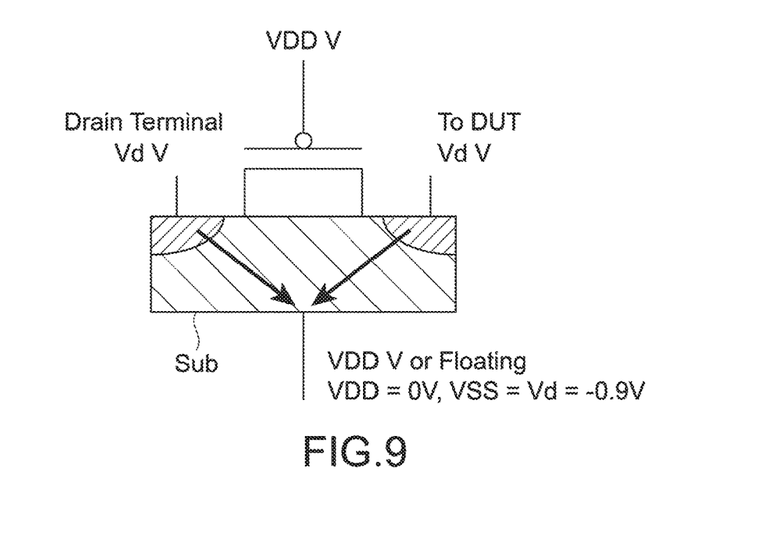
FIG. 9 A diagram for explaining a current leak model of the MOS transistor according to the embodiment of the present technology (transistor to be measured is PMOS).

However, as a result of the circuit simulation carried out by the inventors of the present technology, it was found that the difference between the drain D-side potential (D (V)) and the source S-side potential (S (V)) of the MOS transistor configuring the CMOS switch 2 is almost 0, and a current flowing in the drain D (source S) and the substrate Sub is dominant in the leak current due to a potential difference between potentials of the drain (source) and the substrate Sub (B (V)) of the MOS transistor. In other words, in the CMOS switch 2 shown in FIG. 5, it was found that, even when voltages are applied onto the terminals as shown in FIG. 6 and the NMOS as shown in FIG. 7 is being focused or even when voltages are applied onto the terminals as shown in FIG. 8 and the PMOS as shown in FIG. 9 is being focused, the current flowing in the drain D (source S) and the substrate Sub is dominant.

From this, it can be seen that the leak current can be suppressed by controlling the substrate potential of the MOS transistor configuring the unselected CMOS switch 2 and eliminating the potential difference between the drain D (source S) and the substrate Sub.

At this time, when controlling the substrate potential for suppressing the leak current of the transistor and the like, a potential is normally imparted in a direction in which a threshold value of the transistor becomes deeper. In contrast, the present technology essentially differs in that the voltage is applied to the substrate in a direction in which the threshold value becomes shallower.

Here, the direction in which the threshold value becomes shallower refers to a direction in which the substrate potential is high when the substrate is a P-type substrate and a direction in which the substrate potential is low when the substrate is an N-type substrate.

Further, the threshold value of the MOS transistor is disclosed in Japanese Patent Application Laid-open No. Hei 9-326688, and the contents described in the disclosed patent application are all incorporated in this specification.

Figure 10:
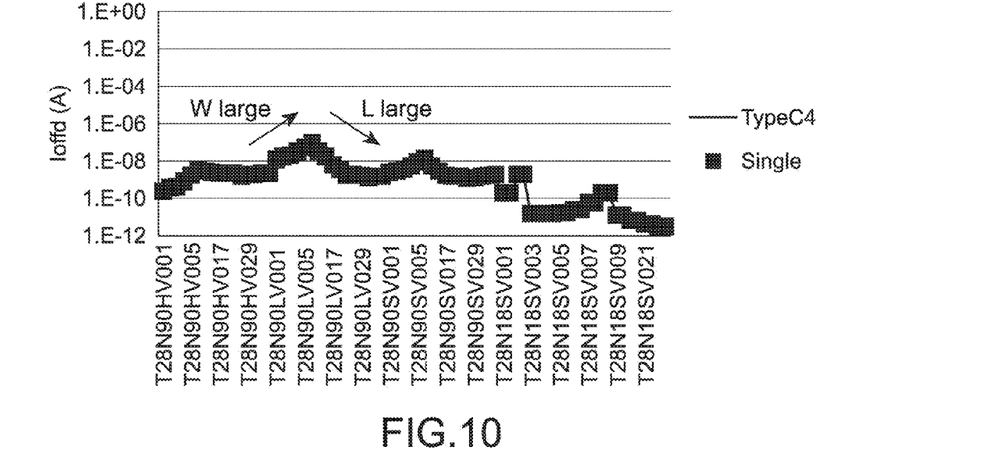
FIG. 10 A graph comparing a drain-side off current obtained by performing a circuit simulation on the circuit shown in FIG. 1 (Type C4 in figure) and a drain-side off current of a normal transistor into which the transistor array TEG is not incorporated (Single in figure).
Figure 11:
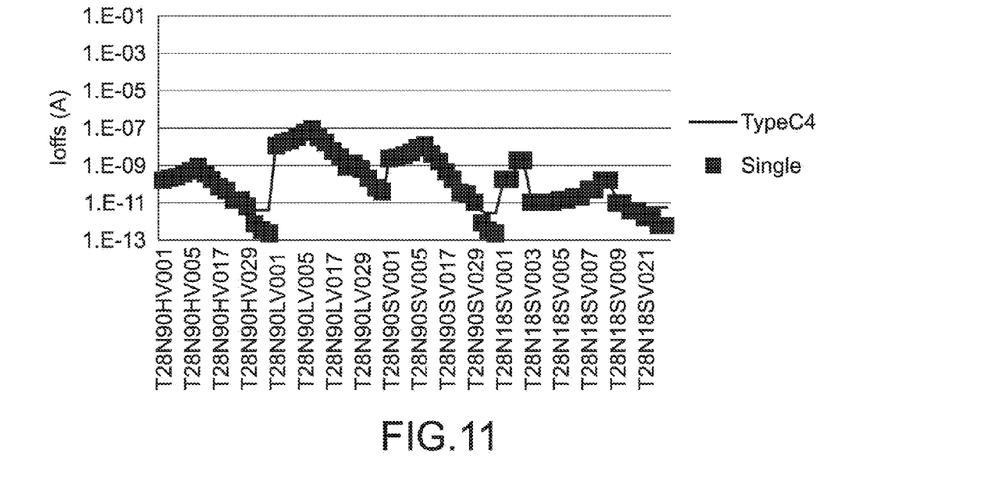
FIG. 11 A graph comparing a source-side off current obtained by performing a circuit simulation on the circuit shown in FIG. 1 (Type C4 in figure) and a source-side off current of a normal transistor into which the transistor array TEG is not incorporated (Single in figure).

FIG. 10 is a graph comparing a drain-side off current obtained by performing a circuit simulation on the circuit and a drain-side off current of a normal transistor into which the transistor array TEG 1 is not incorporated. The abscissa axis represents transistors of various gate sizes, and the ordinate axis represents drain-side off current values. Further, FIG. 11 is a graph comparing source-side off currents similar to those described above. In the figures, W indicates a gate width, and L indicates a gate length. As can be seen from the figures, the off currents of the transistor array TEG 1 according to this embodiment and a normal independent transistor coincide, and thus it was confirmed that a highly accurate measurement can be realized by using the present technology.

It should be noted that regarding the measurement of an on current in which a large current flows, a voltage drop occurs due to electrical resistance in the CMOS switches 2 as it is. However, by monitoring the voltage of the pad Vd sense shown in FIG. 1 and adjusting the voltage of the pad Vdd until the voltage value of the pad Vd sense reaches a desired Vd value, the on current can be acquired while removing the drain wiring resistance and resistance of the CMOS switches 2. Similarly, by monitoring the voltage of the pad Vs sense and adjusting the voltage to be applied to Vss until the voltage of the pad Vs sense becomes 0 V, the on current can be acquired while removing influences of the source-side wiring resistance. Usually, the on current measurement can be realized while removing the influences of the wiring resistance by simultaneously carrying out the processes described above in the source and the drain.

Moreover, in a case where a terminal such as the pad Vd_nonselect terminal shown in FIG. 1 is added, it is desirable for the pad Vd_nonselect to be applied with the same potential as the source terminal of the NMOS 4 when monitoring a drain on current and the pad Vd_nonselect to be applied with the same potential as the drain terminal of the NMOS 4 when monitoring the drain off current.

(Second Embodiment)

Figure 12:
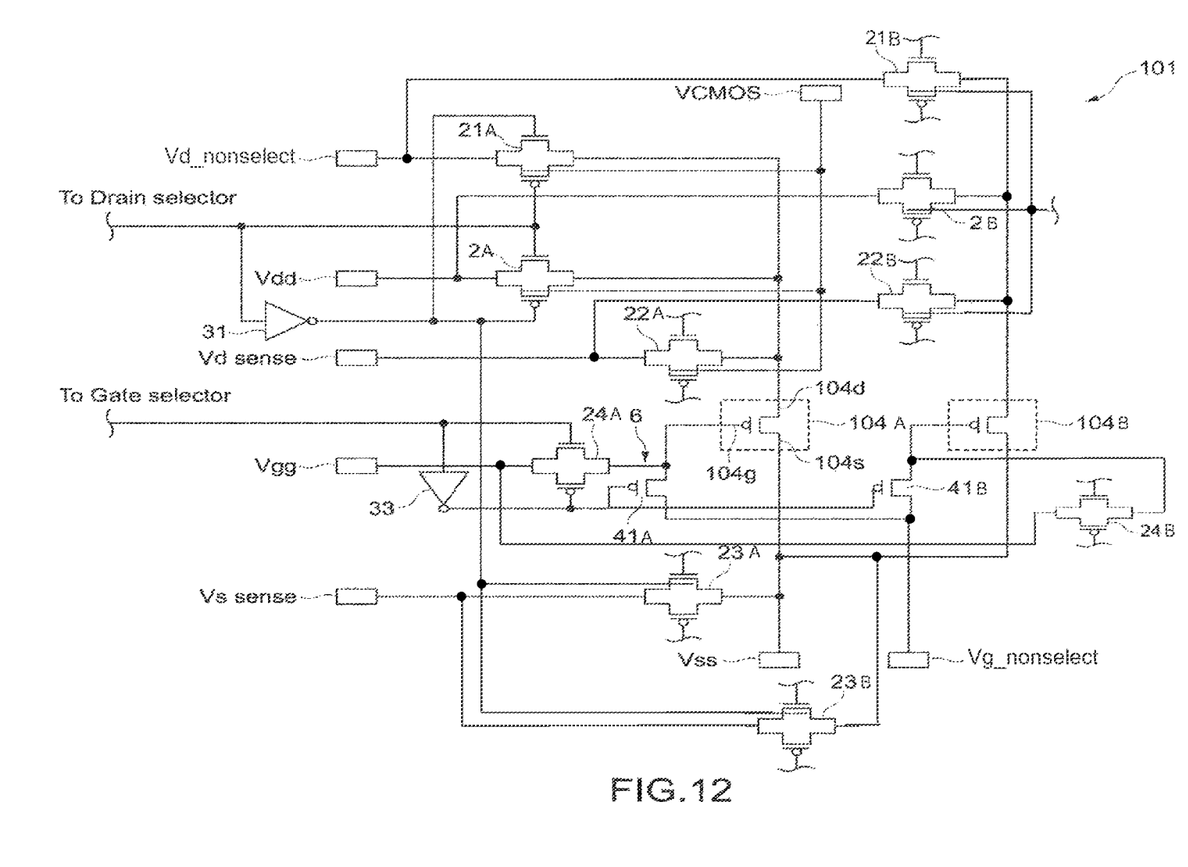
FIG. 12 A circuit diagram showing a configuration of a transistor array TEG as a semiconductor apparatus according to another embodiment of the present technology.

FIG. 12 is a circuit diagram showing a configuration of a transistor array TEG as a semiconductor apparatus according to another embodiment of the present technology.

As shown in the figure, the transistor array TEG 101 differs from that of the embodiment above in that the transistors to be measured, as DUT, are PMOSs 104.

The transistor array TEG 101 configured as described above is a circuit that controls on/off of the CMOS switches 2 and 21 to 23 using transistors that select a plurality of output signal lines based on an input of serial signals from outside to output logical signals different from those of unselected transistors or transistors that select a plurality of output signal lines based on a combination of N-bit signals from N-bit input signal lines to output logical signals different from those of unselected transistors. In addition, VSS (Low-side signal voltage) is output to the selected output lines, and VDD (High-side signal voltage) is output to the unselected output lines.

Figure 13:
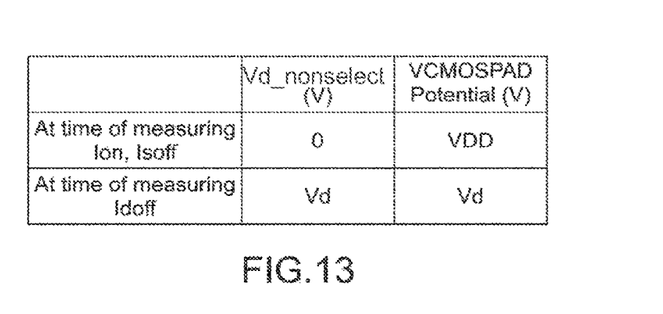
FIG. 13 A table showing application voltages to be switched based on measured amounts in a case where transistors to be measured are PMOS transistors in the transistor array TEG shown in FIG. 12.

In this embodiment, when measuring an off current of the right-hand PMOS 104B out of the two PMOSs 104 shown in FIG. 12, the CMOS switch 2B corresponding to the right-hand PMOS 104B is turned on and the CMOS switch 2A corresponding to the left-hand PMOS 104A is turned off. At this time, as shown in FIG. 13, the potential of PMOS substrates of the CMOS switches 2B, 21B, and 22B connected to the drain terminal 104d of the right-hand PMOS 104B is set to VDD (potential of pad Vss), and a voltage for controlling a threshold value of the MOS transistor in a shallower direction, that is, a voltage Vd to be applied to the drain terminal, for example, is applied onto the PMOS substrates of the CMOS switches 2A, 21A, and 22A connected to the drain terminal 104d of the left-hand PMOS 104A. In this case, for example, in an external apparatus (not shown), the voltage of the pad Vdd may be applied onto the pad VCMOS as it is or a potential of the pad Vdd may be measured to apply a voltage of the same potential. With the circuit configuration in which the substrate potential of NMOS configuring the right-hand CMOS switch 23B is Vd V and the substrate potential of NMOS configuring the left-hand CMOS switch 23B is Vs V, leakages from the CMOS switches leading to the source terminal can be suppressed.

In this embodiment, by applying such a voltage, the off current on the side of the drain terminal of the PMOS 104 as DUT, which is a transistor to be measured, can be measured accurately.

In this embodiment, the transistor to be measured as DUT is constituted of a PMOS transistor, the CMOS switch 2 is connected to the drain terminal of the PMOS transistor as the transistor to be measured, and a predetermined voltage (Vd) is applied to the substrate of PMOS configuring the CMOS switch 2 at a time the transistor is off. However, the CMOS switch 2 may alternatively be connected to the source terminal of the PMOS transistor as the transistor to be measured, and in such a case, a predetermined voltage only needs to be applied onto the substrate of NMOS configuring the CMOS switch 2.

Figure 14:
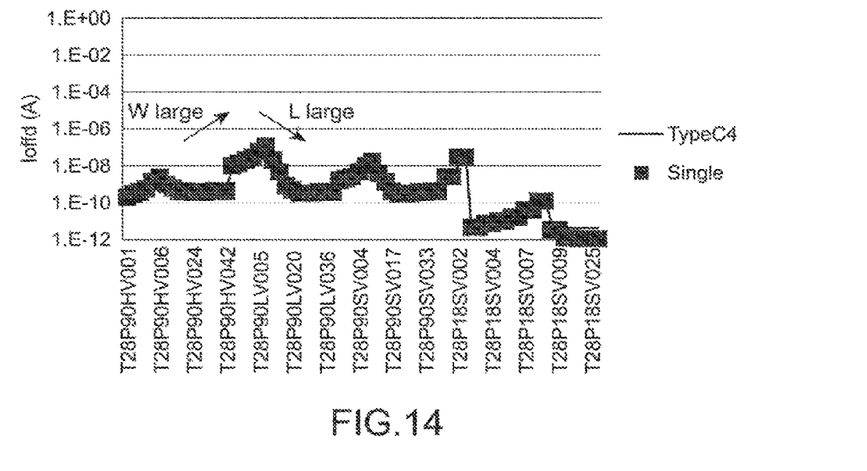
FIG. 14 A graph comparing a drain-side off current obtained by performing a circuit simulation on the circuit shown in FIG. 12 (Type C4 in figure) and a drain-side off current of a normal transistor into which the transistor array TEG is not incorporated (Single in figure).
Figure 15:
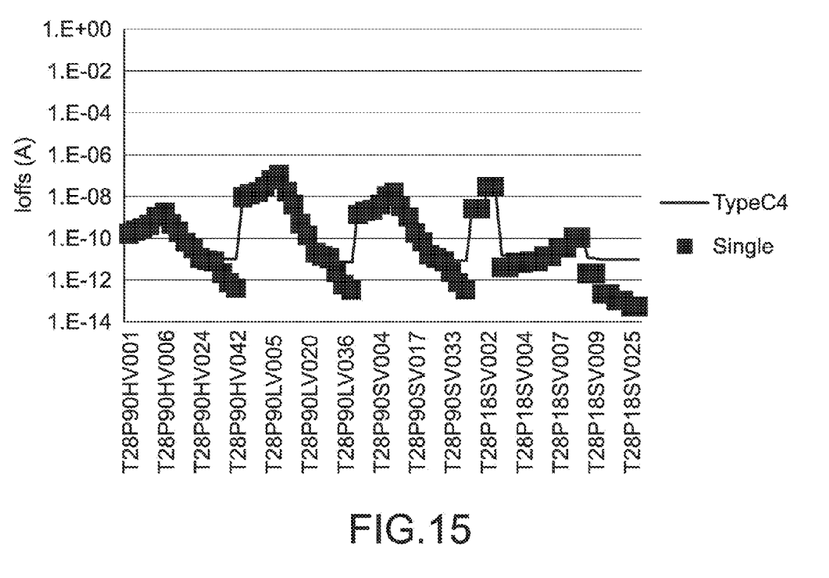
FIG. 15 A graph comparing a source-side off current obtained by performing a circuit simulation on the circuit shown in FIG. 12 (Type C4 in figure) and a source-side off current of a normal transistor into which the transistor array TEG is not incorporated (Single in figure).

FIG. 14 is a graph comparing a drain-side off current obtained by performing a circuit simulation on the circuit and a drain-side off current of a normal transistor into which the transistor array TEG 101 is not incorporated. The abscissa axis represents transistors of various gate sizes, and the ordinate axis represents drain-side off current values. Further, FIG. 15 is a graph comparing source-side off currents similar to those described above. In the figures, W indicates a gate width, and L indicates a gate length. As can be seen from the figures, the off currents of the transistor array TEG 101 according to this embodiment and a normal independent transistor coincide, and thus it was confirmed that a highly accurate measurement can be realized by using the present technology.

It should be noted that regarding the measurement of an on current in which a large current flows as in the first embodiment, a voltage drop occurs due to electrical resistance in the CMOS switches 2 as it is. However, by monitoring the voltage of the pad Vd sense shown in FIG. 12 and adjusting the voltage of the pad Vdd until the voltage value of the pad Vd sense reaches a desired Vd value, the on current can be acquired while removing the drain wiring resistance and resistance of the CMOS switches 2. Similarly, by monitoring the voltage of the pad Vs sense and adjusting the voltage to be applied to Vss until the voltage of the pad Vs sense becomes 0 V, the on current can be acquired while removing influences of the source-side wiring resistance. Usually, the on current measurement can be realized while removing the influences of the wiring resistance by simultaneously carrying out the processes described above in the source and the drain.

Moreover, in a case where a terminal such as the pad Vd_nonselect terminal shown in FIG. 12 is added, it is desirable for the pad Vd_nonselect to be applied with the same potential as the source terminal of the PMOS 104 when monitoring a drain on current and the pad Vd_nonselect to be applied with the same potential as the drain terminal of the PMOS 104 when monitoring the drain off current.

(Third Embodiment)

In recent years, as a technology to realize low power consumption of an LSI circuit, a technology of controlling on/off of a circuit module in a circuit using a switch transistor is widely used. In addition, a technology of controlling a size of voltages to be applied onto the circuit module according to an operation state of the circuit module is also in wide use. For the two technologies to be compatible with each other, it is desirable to use a CMOS switch as the switch transistor that turns on/off the circuit module.

Usually, however, a switch in which a current sufficient enough to operate the circuit module flows needs to be used as the CMOS switch, and a leak current of such a switch becomes large at the time the switch is off, thus causing a problem in the point of suppression of power consumption. In this embodiment, a technology for suppressing power consumption as described above will be disclosed.

Figure 16:
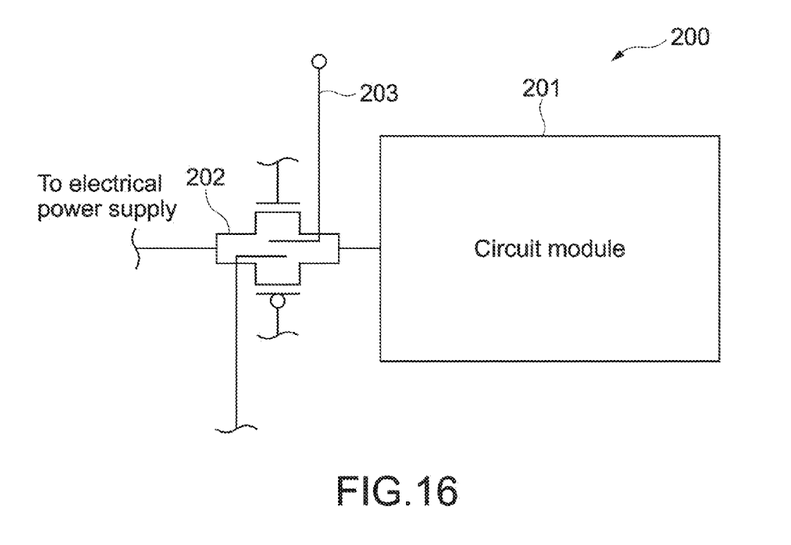
FIG. 16 A diagram showing a configuration of a circuit as the semiconductor apparatus that switches on/off of a circuit module in a circuit according to further another embodiment of the present technology.

FIG. 16 is a circuit diagram showing a configuration of a circuit as the semiconductor apparatus that switches on/off of a circuit module in a circuit using a switch.

As shown in the figure, in the circuit 200, a circuit module 201 is connected to an electrical power supply (not shown) via a CMOS switch 202. Examples of the circuit module 201 include an MPEG decoder and a D/A converter.

The switch is usually configured by the PMOS alone, but in a circuit that varies a clock frequency according to a usage state of the circuit, for example, a power supply voltage to be applied onto the circuit may be varied. In this case, when the voltage is low, a voltage drop occurs if the switch that switches on/off the circuit module is PMOS, to thus cause a failure.

To avoid such a situation, by using a CMOS switch as the switch that switches on/off the circuit module, a voltage drop in the switch can be avoided even in a low voltage state.

At this time, however, in the NMOS configuring the CMOS switch 202 shown in FIG. 16, for example, a leak current due to a potential difference between the voltage applied to the circuit module 201, that is, the voltage applied to the CMOS switch 202, and the substrate voltage of the NMOS in the CMOS switch 202 becomes a problem.

Further, as the transistor (CMOS switch 202 in this case) that switches on/off the circuit module 201, a transistor having a large gate width and high driving performance is used so as to be capable of supplying necessary power when the circuit module 201 is operated at full capacity. Therefore, the leak current in the standby state becomes relatively large, which is a problem in terms of low power consumption of the circuit.

To avoid such a situation, by setting the substrate voltage of NMOS configuring the CMOS switch 202 as VSS in a state where the CMOS switch 202 is on and applying the same voltage as that applied onto the side of the electrical power supply of the CMOS switch 202 in an off state by a voltage application unit 203, it becomes possible to suppress the current with respect to the substrate of the transistor configuring the CMOS switch 202 and realize low power consumption.

It should be noted that in the CMOS switch 202 shown in FIG. 16, it is only necessary to set the substrate voltage of PMOS to have the same potential as the electrical power supply, the gate voltage of NMOS to have the same potential as the electrical power supply when selected and set to 0 V when unselected, and the gate voltage of PMOS to be set to 0 V when selected and to have the same potential as the electrical power supply when unselected.

It should be noted that while there is a technology of suppressing power consumption by applying, onto a substrate of a transistor in a circuit module, a voltage with which a threshold value of the transistor becomes deeper, the present technology relates to the switch that switches on/off the circuit module, and since the voltage to be applied to the substrate is a voltage with which the threshold value of the transistor becomes shallower for suppressing a leak current, the present technology totally differs from the technology described above.

(Others)

The present technology is not limited to the embodiments above.

For example, the present technology is also applicable to a switch transistor that controls on/off of a circuit module in a circuit. Specifically, by eliminating a potential difference between a drain (source) and substrate of the switch transistor that is switching off the circuit module, a leak current of the switch transistor is suppressed, and additional low power consumption of the circuit can be realized.

It should be noted that the present technology can also take the following configurations.
(1) A semiconductor apparatus, including:
  a MOS transistor; and
  a voltage application unit that applies, when the MOS transistor is off, a voltage for controlling a threshold value of the MOS transistor in a shallower direction onto a substrate of the MOS transistor.
(2) The semiconductor apparatus according to (1), further including
  a plurality of transistors to be measured;
  at least one pad that extracts an output from a terminal of each of the plurality of transistors to be measured; and
  a selector circuit that selects a transistor to be measured as a measurement target from the plurality of transistors to be measured,
  wherein the MOS transistor is interposed between the terminal of each of the plurality of transistors to be measured and the pad.
(3) The semiconductor apparatus according to (2), in which
  the transistor to be measured is constituted of an NMOS transistor,
  the MOS transistor is constituted of a CMOS switch,
  the CMOS switch is connected to a drain terminal of the transistor to be measured, and
  the voltage application unit applies a voltage to a substrate of NMOS configuring the CMOS switch.
(4) The semiconductor apparatus according to (2), in which
  the transistor to be measured is constituted of an NMOS transistor,
  the MOS transistor is constituted of a CMOS switch,
  the CMOS switch is connected to a source terminal of the transistor to be measured, and
  the voltage application unit applies a voltage to a substrate of PMOS configuring the CMOS switch.
(5) The semiconductor apparatus according to (2), in which
  the transistor to be measured is constituted of a PMOS transistor,
  the MOS transistor is constituted of a CMOS switch,
  the CMOS switch is connected to a drain terminal of the transistor to be measured, and
  the voltage application unit applies a voltage to a substrate of PMOS configuring the CMOS switch.
(6) The semiconductor apparatus according to (2), in which
  the transistor to be measured is constituted of a PMOS transistor,
  the MOS transistor is constituted of a CMOS switch,
  the CMOS switch is connected to a source terminal of the transistor to be measured, and
  the voltage application unit applies a voltage to a substrate of NMOS configuring the CMOS switch.
(7) The semiconductor apparatus according to (1), further including:
  a predetermined circuit; and
  an electrical power supply that supplies power to the circuit,
  in which the MOS transistor is interposed between the circuit and the electrical power supply.
(8) A method of controlling a MOS transistor, including:
  turning on/off the MOS transistor; and
  applying, when the MOS transistor is off, a voltage for controlling a threshold value of the MOS transistor in a shallower direction onto a substrate of the MOS transistor.
(9) A semiconductor apparatus, comprising:
  a MOS switch; and
  a voltage application unit that applies, when the MOS switch is off, a voltage onto a substrate of the MOS switch so that a leak current flowing in the MOS switch is suppressed.

DESCRIPTION OF SYMBOLS 1, 101 transistor array TEG
2 CMOS switch as MOS transistor
4 NMOS as transistor to be measured
104 PMOS as transistor to be measured
VCMOS, 203 pad as voltage application unit
200 predetermined circuit
201 circuit module
202 CMOS switch

The invention claimed is:
1. A semiconductor apparatus, comprising:
  a plurality of transistors;
  a pad configured to extract an output from a terminal of a first transistor of the plurality of transistors;
  a MOS transistor between the terminal of the first transistor and the pad; and
  a voltage application unit configured to:
    apply, in an OFF state of the MOS transistor, a voltage to a substrate of the MOS transistor such that a threshold value of an operation parameter of the MOS transistor is reduced.
2. The semiconductor apparatus according to claim 1, further comprising:
  a selector circuit configured to select the first transistor from the plurality of transistors.
3. The semiconductor apparatus according to claim 1, wherein
  the first transistor is a first NMOS transistor,
  the MOS transistor is a CMOS switch,
  the CMOS switch is connected to a drain terminal of the first transistor, and
  the voltage application unit is further configured to apply the voltage to a substrate of a second NMOS transistor of the CMOS switch.

4. The semiconductor apparatus according to claim 1, wherein
the first transistor is an NMOS transistor,
the MOS transistor is a CMOS switch,
the CMOS switch is connected to a source terminal of the first transistor, and
the voltage application unit is further configured to apply the voltage to a substrate of a PMOS transistor of the CMOS switch.

5. The semiconductor apparatus according to claim 1, wherein
the first transistor is a first PMOS transistor,
the MOS transistor is a CMOS switch,
the CMOS switch is connected to a drain terminal of the first transistor, and
the voltage application unit is further configured to apply the voltage to a substrate of a second PMOS transistor of the CMOS switch.

6. The semiconductor apparatus according to claim 1, wherein
the first transistor is a PMOS transistor,
the MOS transistor comprises a CMOS switch,
the CMOS switch is connected to a source terminal of the first transistor, and
the voltage application unit is further configured to apply the voltage to a substrate of an NMOS transistor of the CMOS switch.

7. The semiconductor apparatus according to claim 1, further comprising:
a circuit; and
an electrical power supply configured to supply power to the circuit,
wherein the MOS transistor is between the circuit and the electrical power supply.

8. A method of controlling a MOS transistor, comprising:
extracting, by a pad, an output from a terminal of a first transistor of a plurality of transistors,
wherein the MOS transistor is between the terminal of the first transistor and the pad; and
applying, in an OFF state of the MOS transistor, a voltage to a substrate of the MOS transistor such that a threshold value of an operation parameter of the MOS transistor is reduced.

9. A semiconductor apparatus, comprising:
a transistor;
a pad configured to extract an output from a terminal of the transistor;
a MOS transistor between the terminal of the transistor and the pad; and
a voltage application unit configured to:
apply, in an OFF state of the MOS transistor, a voltage to a substrate of the MOS transistor; and
reduce a threshold value of an operation parameter of the MOS transistor, based on the applied voltage.

* * * * *